(12) United States Patent
Preil et al.

(10) Patent No.: US 8,889,343 B2
(45) Date of Patent: Nov. 18, 2014

(54) OPTIMIZING LITHOGRAPHIC PROCESSES USING LASER ANNEALING TECHNIQUES

(71) Applicant: GLOBALFOUNDRIES Inc., Grand Cayman (KY)

(72) Inventors: Moshe E Preil, Sunnyvale, CA (US); Gerard M. Schmid, Albany, NY (US); Richard A. Farrell, Albany, NY (US); Ji Xu, Watervliet, NY (US); Thomas I. Wallow, San Carlos, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/726,732

(22) Filed: Dec. 26, 2012

(65) Prior Publication Data

US 2014/0178824 A1    Jun. 26, 2014

(51) Int. Cl.
*G03F 7/26* (2006.01)
*G03F 7/20* (2006.01)

(52) U.S. Cl.
CPC ...................................... *G03F 7/20* (2013.01)
USPC ........................... 430/322; 430/328; 430/330

(58) Field of Classification Search
CPC ............ H01L 21/268; H01L 21/02691; H01L 21/02686; H01L 27/1285; H01L 21/324; H01L 21/76864; H01L 21/02675; C30B 1/02; G03F 7/20
USPC ......................................... 430/322, 328, 330
See application file for complete search history.

(56) References Cited

U.S. PATENT DOCUMENTS

2009/0233236 A1*   9/2009   Black et al. ................... 430/311

* cited by examiner

*Primary Examiner* — Caleen Sullivan
(74) *Attorney, Agent, or Firm* — Hunter E. Webb; Keohane & D'Alessandro, PLLC

(57) ABSTRACT

Approaches for utilizing laser annealing to optimize lithographic processes such as directed self assembly (DSA) are provided. Under a typical approach, a substrate (e.g., a wafer) will be subjected to a lithographic process (e.g., having a set of stages/phases, aspects, etc.) such as DSA. Before or during such process, a set of laser annealing passes/scans will be made over the substrate to optimize one or more of the stages. In addition, the substrate could be subjected to additional processes such as hotplate annealing, etc. Still yet, in making a series of laser annealing passes, the techniques utilized and/or beam characteristics of each pass could be varied to further optimize the results.

22 Claims, 13 Drawing Sheets

APPLYING LASER ANNEAL TO ACHIEVE LOWER K IN IDL

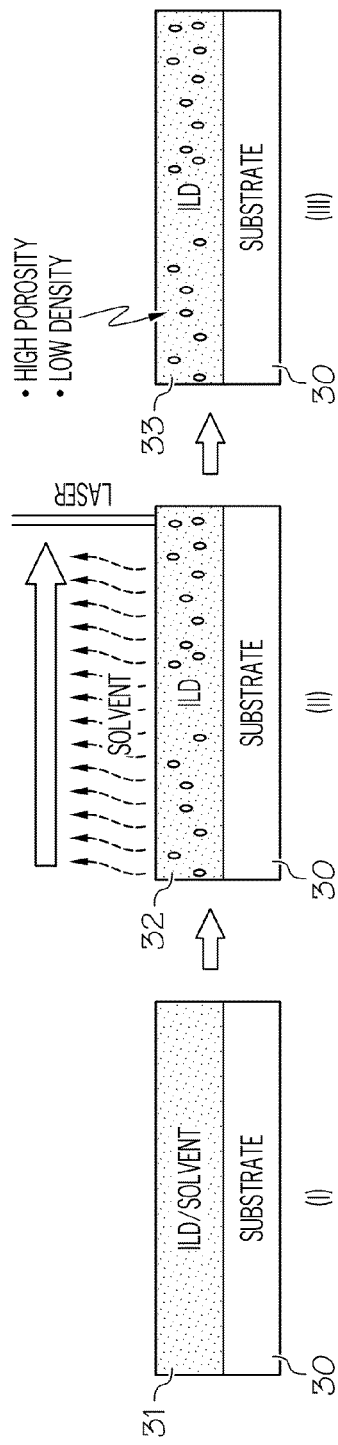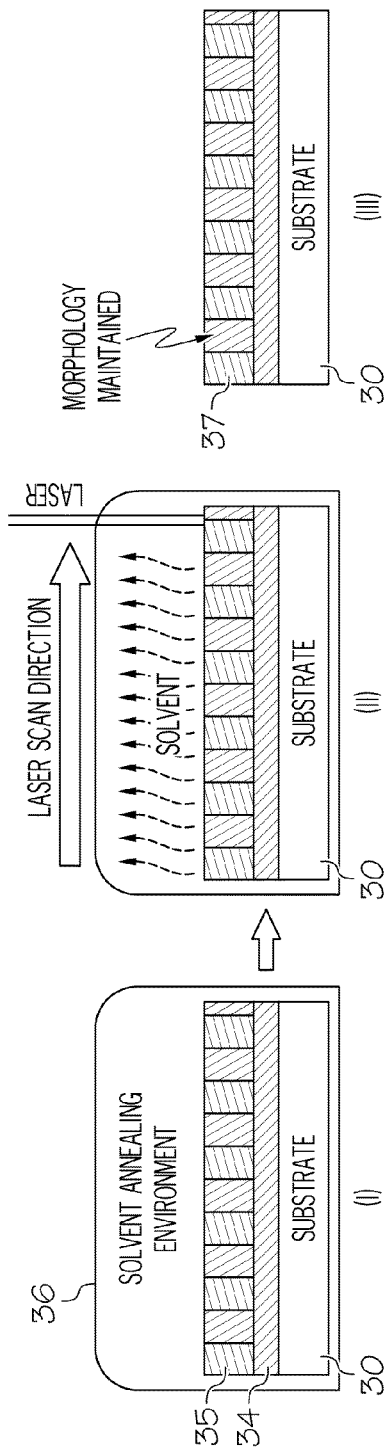

OPTIMIZING LITHOGRAPHIC PROCESSES USING LASER ANNEALING TECHNIQUES

BACKGROUND

1. Technical Field

This invention relates generally to the field of semiconductors and, more particularly, to utilizing laser annealing techniques for optimizing lithographic processes such as directed self assembly.

2. Related Art

Directed self assembly (DSA) typically requires an annealing processing step, which causes block co-polymers (BCPs) to micro-phase separate and aligns the micro-domains in a thermodynamically preferred orientation. Incomplete processing may cause defects in the desired pattern. Moreover, after processing, the wafers must be cooled back down to room temperature. If this cooling is not properly controlled, defects may be present in the final pattern. One existing approach resolving this is to subject the wafer to very long bakes, or to bake at elevated temperatures, neither of which is desirable. That is, long bake times reduce throughput and increase cost, while high temperature baking risks oxidizing or otherwise damaging the BCP material and preventing self-assembly and full alignment. Laser annealing is a method for effecting substrate baking with very short durations by irradiating a substrate and/or structure at a laser wavelength that is substantially absorbed by the substrate and/or structure. The temperature versus time profile of a laser annealing process can be precisely controlled, for example, by varying the exposure intensity, the laser power, and/or the rate at which the laser is scanned across the substrate, etc.

SUMMARY

In general, aspects of the present invention relate to approaches for utilizing laser annealing to optimize lithographic processes such as directed self assembly (DSA). Under a typical approach, a substrate (e.g., a wafer) will be subjected to a lithographic process (e.g., having a set of stages/phases, aspects, etc.). Before or during such process, a set of laser annealing passes/scans will be made over the substrate to optimize a result of one or more of the stages. In addition, the substrate could be subjected to additional processes such as hotplate annealing, etc. Still yet, in making a series of laser annealing passes, the techniques utilized and/or beam characteristics thereof could be varied to further optimize the results.

A first aspect of the present invention provides a method for optimizing a lithographic process, comprising: subjecting a substrate to a lithographic process having a set of stages; and applying a set of laser annealing passes to the substrate to optimize at least one of the set of stages.

A second aspect of the present invention provides a method for optimizing a lithographic process, comprising: subjecting a substrate to a lithographic process having a set of stages; applying a set of laser annealing passes to the substrate; and applying a set of additional processing techniques to the substrate, the set of laser annealing passes and the set of additional processing techniques optimizing at least one of the set of stages.

A third aspect of the present invention provides a method for optimizing a lithographic process, comprising: subjecting a substrate to a directed self assembly (DSA) process, the DSA process having a set of stages; applying a first laser annealing pass to the substrate; and applying a second laser annealing pass to the substrate.

BRIEF DESCRIPTION OF THE DRAWINGS

These and other features of this invention will be more readily understood from the following detailed description of the various aspects of the invention taken in conjunction with the accompanying drawings in which:

FIG. 3A shows the application of laser annealing to achieve lower dielectric constant K in interlayer dielectric ILD according to an embodiment of the present invention.

FIG. 3B shows the application of laser annealing to quench the stable/metastable morphologies in solvent-annealed BCP films according to an embodiment of the present invention.

Figure 1:
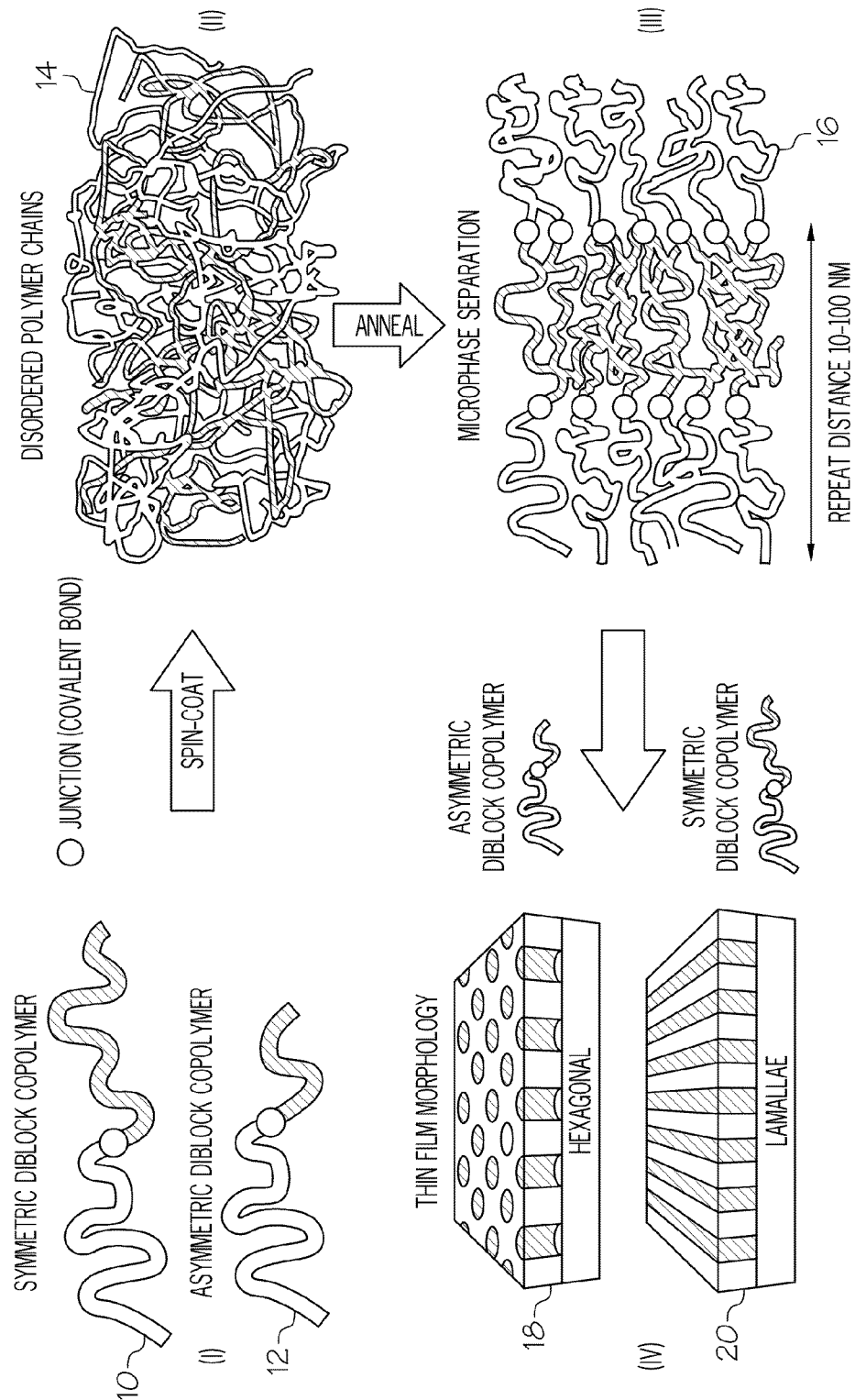
FIG. 1 shows a polymer phase separation stage of a DSA process according to an embodiment of the present invention.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Illustrative embodiments will now be described more fully herein with reference to the accompanying drawings, in which embodiments are shown. This disclosure may, however, be embodied in many different forms and should not be construed as limited to the embodiments set forth herein. Rather, these embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer) is present on a second element, such as a second structure (e.g. a second layer) wherein intervening elements, such as an interface structure (e.g. interface layer) may be present between the first element and the second element.

As indicated above, aspects of the present invention relate to approaches for utilizing laser annealing to optimize lithographic processes such as directed self assembly (DSA). Under a typical approach, a substrate (e.g., a wafer) will be subjected to a lithographic process (e.g., having a set of stages/phases, aspects, etc.) such as DSA. Before or during such process, a set of laser annealing passes/scans will be made over the substrate to optimize one or more of the stages. In addition, the substrate could be subjected to additional processes such as hotplate annealing, etc. Still yet, in making a series of laser annealing passes, the techniques utilized and/or beam characteristics of each pass could be varied to further optimize the results.

As such, aspects described herein will set forth various approaches and/or techniques for utilizing laser annealing processes to facilitate and/or optimize lithographic processes (e.g., the "stages/phases" thereof) such as DSA. It is understood that although the illustrative embodiments described herein pertain to DSA, this need not be the case. That is, as will be further shown below, laser annealing processes may be utilized to optimize a variety of lithographic processes.

For convenience purposes, this section of the Detailed Description of the Invention will have the following subsections:

I. Laser Annealing to Optimize Phase Separation during DSA
II. Multiple Passes to Optimize Multiple Phases/Aspects of DSA
III. Varying Types of Annealing Techniques
IV. Additional Considerations I. Laser Annealing to Optimize Phase Separation During DSA In a first approach, a set of laser annealing passes/scans may be made to a substrate undergoing lithographic processes (e.g., DSA) to optimize one or more of the phases thereof. Typically, DSA requires an annealing step, typically a thermal anneal, which induces block copolymers (BCP) to microphase separate and aligns the micro-domains in a thermodynamically preferred orientation. Referring to FIG. 1, a diagram depicting a polymer microphase separation phase/stage of DSA is shown. As depicted in steps I-IV, by spin-coating a symmetric di-block copolymer 10 or an asymmetric di-block copolymer 12 onto an underlayer, a phase-mixed BCP thin film 14 is formed. By thermal annealing the phase-mixed BCP film above the glass transition temperature, it will undergo microphase separation to form a phase separated film. Thereafter, a thin film morphology will result to yield a hexagonal close packed array of cylinders 18 (from asymmetric copolymer 12) or a Lamallae line/space array 20 (from symmetric copolymer 10). Under previous thermal annealing approaches, effects associated with subsequent bakes resulted in the formation of BCP-related defects and/or other process limitations. To address such issues, wafers undergoing DSA may be subjected to a set of laser annealing processes. One such pass may be directed to optimize phase separation such as that illustrated in FIG. 1. Along these lines, there are multiple techniques that may be employed for this pass.

In one technique, laser annealing may be applied to assist processing of orientation control layers which may contain crosslinking additives. By heating the material to a high enough temperature, the grafting chemistry and/or cross-linking mechanism may be effectively triggered. Still yet, the short dwell time of laser anneal avoids undesirable polymer degradation and/or change in surface energy and can drastically reduce the process time by several orders of magnitude.

Figure 2:
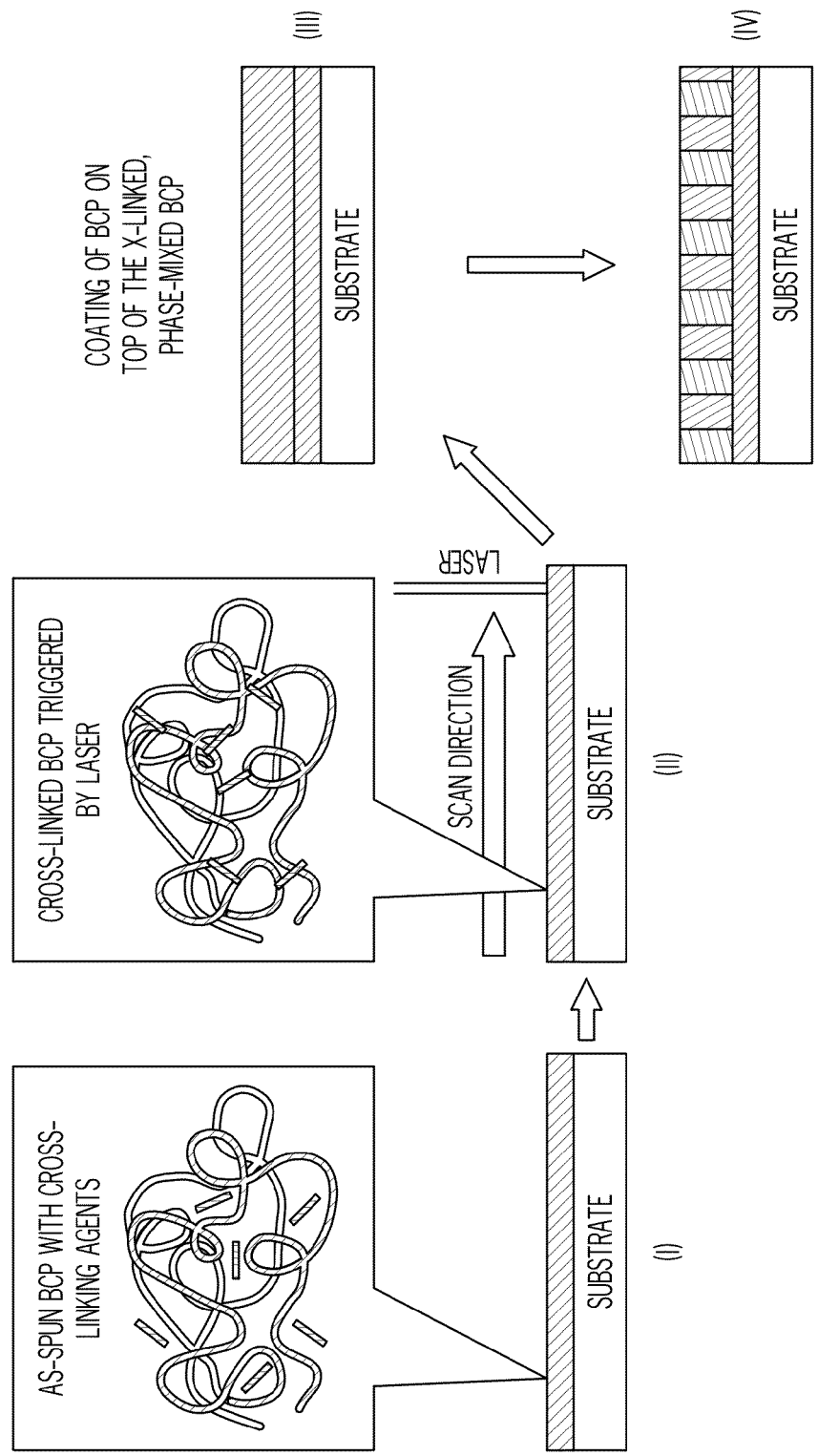
FIG. 2 shows the application of laser annealing to maintain a phase-mixed state of BCP and the creation of neutral material according to an embodiment of the present invention.

In another technique, annealing may be applied to maintain the phase-mixed state of BCP through cross-linking and use the BCP itself as the orientation control layer. An example of this is shown in steps I-IV of FIG. 2. As depicted, step I shows an as-spun BCP with cross-linking agents, while step II shows a cross-linked BCP triggered by a laser application with the scan direction as shown. In step III, a coating of BCP is present on top of the cross-linked, phase-mixed BCP, and in step IV, an annealing is performed to yield a phase-separated BCP thin film. By using laser annealing to reach a temperature such that the cross-linking of BCP chains is effectively triggered before the polymer chains mobilize and self-assemble, the first BCP coating may be trapped in the phase-mixed state and utilized as a neutral material. To this end, a cross-linking agent may be added into the BCP, or functional groups with cross-linking capability may be chemically incorporated onto the polymer chain. If the polymer already contains components that are thermally cross-linkable under laser anneal, then the addition of cross-linking agents/functional groups is not necessary. This application of laser annealing thus eliminates the necessity of purposely synthesized neutral materials and can lead to substantial savings on the cost of materials.

In yet another approach, laser annealing is applied to quickly drive off solvent from a coating. Specifically, a spike of temperature in the material will vaporize the solvent instantaneously, while the short duration prevents the coating material from responding accordingly; and hence the pre-solvent-drying structure of the material is fixed. As shown in FIGS. 3A-B, this approach could be potentially used in multiple cases. As first shown in steps I-III of FIG. 3A, a high porosity and very low density may be obtained by using laser annealing to drive off the solvent of a swelled ILD. Since porosity and low density lead to low dielectric constant of the material, the ILD created has a better insulating property. In step I of FIG. 3A, a substrate 30 is coated with an ILD material 31 that includes porogen solvent. This material undergoes a laser annealing in step II to remove the solvent. This results in a solvent-free (or reduced) layer 33 in step III having a high porosity and a low density. As shown in steps I-III of FIG. 3B, a desirable morphology in a solvent annealed BCP system may be maintained by using laser annealing to drive off the solvent. Specifically, in step I of FIG. 3B, a substrate coated with an orientation control layer 34 and BCP layer 35 is placed in a solvent annealing environment 36, and then subjected to a laser annealing in the environment in step II. The result is shown in step III with a substrate 37 having its desirable morphology maintained by rapid removal of the solvent. The uncontrolled desorption of solvent and the accompanying reduction of film thickness at the end of a solvent annealing process may be disruptive to the desired morphology. Laser annealing can address this potential issue by maintaining the dynamically trapped morphology. Although not separately shown, a dehydration of certain stack layers (such as Si-ARC) may also be done via laser annealing. This can potentially eliminate any thermal budget or throughput issues when dehydration is done on a conventional hot plate.

In another approach, laser annealing may be applied to promote diffusion/reaction of an etch-rate modifier. For example, Si-containing gases can selectively diffuse into/react with a polymer in a much faster fashion via laser annealing, so that one block of the BCP is selectively doped with Si, and hence exhibits higher etching resistance than the other block. This will improve the quality of the pattern transfer process.

In another approach, multiple wavelengths of irradiation may be combined. That is, a wavelength laser annealing may be combined with irradiation of another wavelength and/or type to achieve desired results. For example, after IR wavelength laser annealing, UV wavelength irradiation may be applied to cross-link or degrade one component of the BCP.

Figure 4:
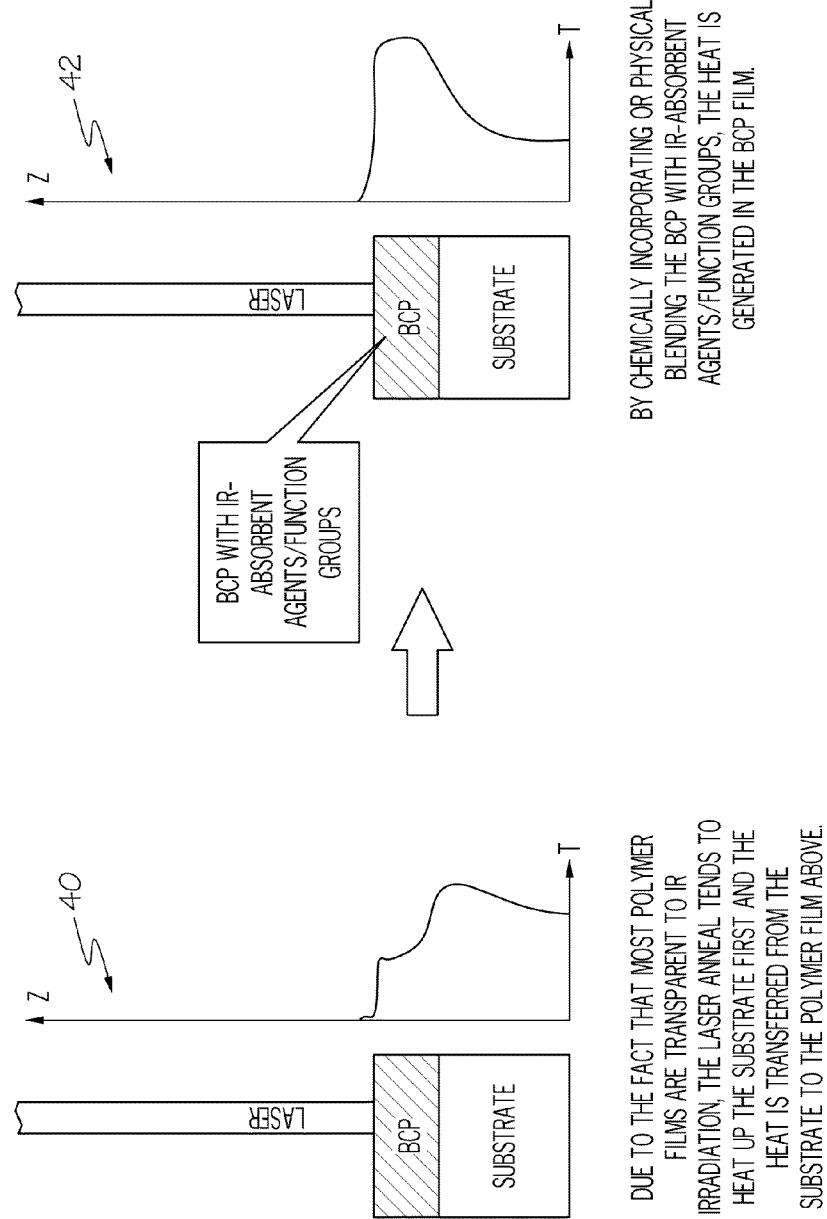
FIG. 4 shows the application of laser annealing to selectively heat a BCP or component(s) of the BCP by addition of IR-absorbent agents and/or functional groups according to an embodiment of the present invention.

In yet another approach, laser annealing may be applied to selectively heat the BCP or select components of the BCP. An example of this is shown in FIG. 4. As first shown in graph 40, due to the fact that most polymer films are substantially transparent to IR radiation, the laser anneal tends to heat up the substrate first, and the heat is transferred from a substrate to a polymer film above. This could result in delayed annealing or non-uniform heating in the polymer film, especially when the layer stack underneath is complicated. This also requires that the underlying materials are stable to this thermal processing. A solution to this problem is to chemically incorporate or physically blend the BCP with IR-absorbent chromophores, such that the heat is generated within the BCP film. Graph 40 shows how the temperature rise may be substantially localized within the BCP film. In particular, the laser wavelength will be chosen to match the absorption spectrum of the IR-absorbent chromophores. An IR-absorbent agent that preferentially associates with one component of the BCP can also be incorporated, so that the laser annealing can selectively increase the temperature of this component and trigger desired reaction(s) such as polymer chain degradation, while the other component is kept intact.

II. Multiple Passes to Optimize Multiple Phases/Aspects of DSA

It is understood that the use of laser annealing to optimize one or more phases of a lithographic process such as DSA need not be limited to a single pass/scan. That is, multiple passes may be utilized to optimize various aspects of the process. For example, a first pass of BCP annealing may be performed as described above to optimize phase separation. That is, a BCP film may be treated using the laser annealing method at low temperature/power, selected such that the processing is performed within the thermal stability limits of the BCP and/or substrate materials.

Figure 5:
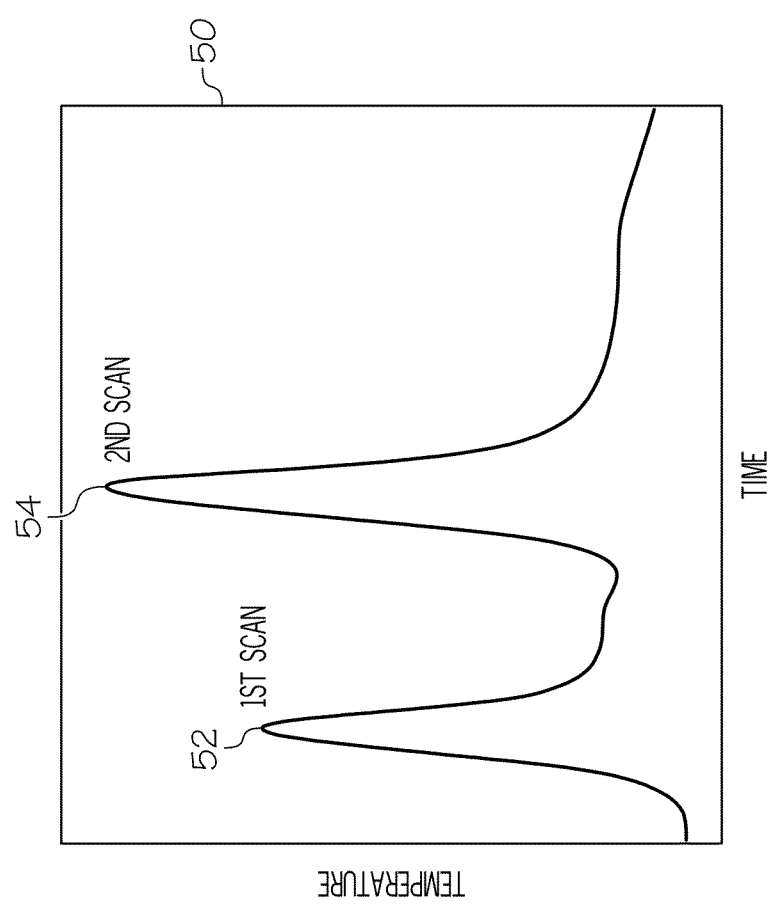
FIG. 5 shows a graph of temperature versus time for a double-pass laser annealing of block copolymer films for repair of defects within DSA patterns and/or to produce self-developing DSA patterns according to an embodiment of the present invention.

One or more additional passes may be made to optimize other phases/aspects of the DSA process such as to facilitate one or more chemical reactions of different "blocks." For example, a second laser annealing pass may be made to induce chemical decomposition of "A" block. In this aspect, the laser will be rescanned at a higher temperature/power, above the thermal decomposition temperature of one block. The decomposed block may undergo thermal decomposition (such as un-zipping), or the junction between the A-B blocks may decompose and the one block be removed via solvent, for example. Similarly, a laser annealing pass may be made to facilitate cross-linking of "B" block. Specifically, under this aspect, the laser may be rescanned at a higher temperature and/or power (e.g., above the first scan temperature but below decomposition temperature of that particular block) to promote cross-linking and/or enhance etch stability. An example of multiple laser annealing passes is shown in FIG. 5, which depicts a graph 50 showing two scans, with the second scan 54 occurring at a higher temperature than the first scan 52.

Figure 6A:
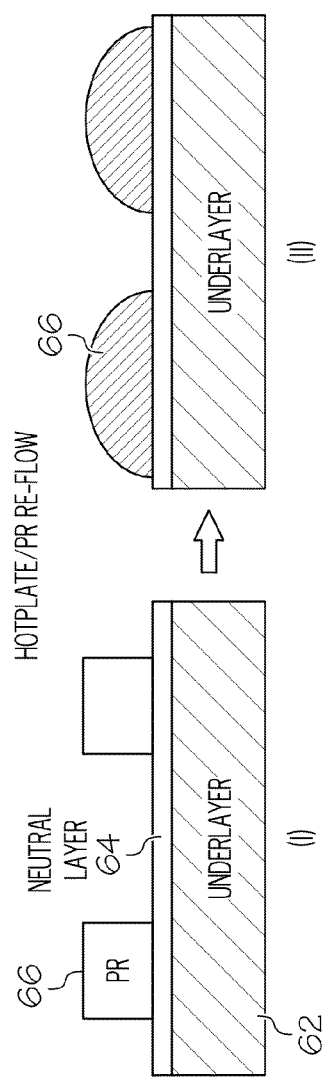
FIG. 6A shows a patterned photoresist on a substrate where reflow has occurred under normal bake conditions on a hotplate according to an embodiment of the present invention.
Figure 6B:
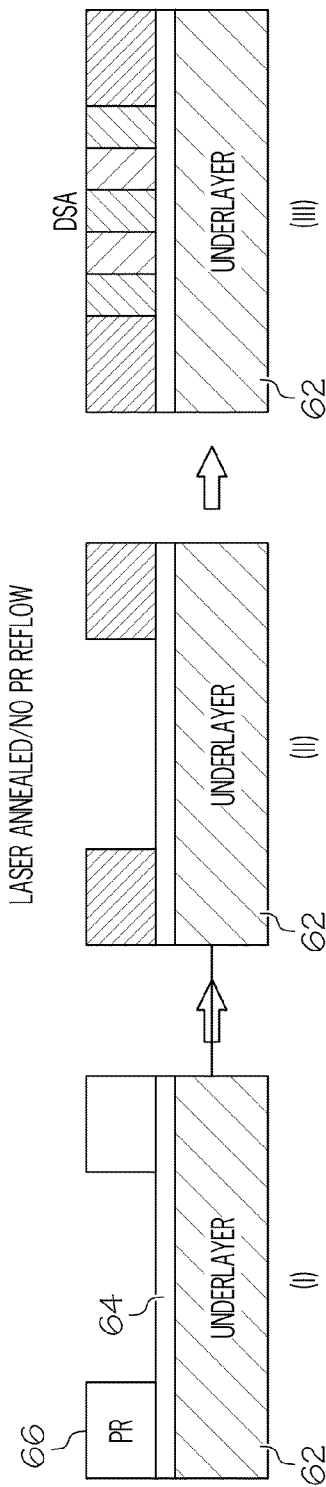
FIG. 6B shows a DSA process flow based on graphoepitaxy being laser annealed where photoresist reflow is negligible and the DSA process is optimized according to an embodiment of the present invention.

In another aspect, a subsequent laser annealing pass could be made to avoid thermal reflow of photoresists (PRs). As shown in FIG. 6A, an underlayer 62 is provided with a neutral layer 64 and a PR layer 66 in step I. When subjected to a hotplate, the result is undesirable reflowing of PR layer 66 as shown in step II. To address this, one aspect will utilize laser annealing to avoid thermal reflowing of PR 66. Specifically, as shown in steps I-III of FIG. 6B, PR 66 BCP's are simultaneously baked, and subjected to laser annealing (step II of FIG. 6B) to avoid reflow.

In another aspect, the laser anneal can be used to minimize thermal reflow of patterned photoresists which can be used as a guide for graphoepitaxy DSA. Since DSA annealing times may cause reflow of resist or pattern shifting under normal hotplate conditions for DSA annealing, a short laser anneal may simultaneously anneal the BCP film while minimizing resist reflow. It is also possible to induce thermal cross-linking of the photoresist features 66 prior to or simultaneous to a BCP annealing step, thus improving the throughput of the processing.

III. Varying Types of Annealing Techniques

It is understood that in addition to making one or more laser annealing passes, other techniques could be implemented. That is, the approaches described herein could be utilized in combination with various other techniques such as hot plate and/or cold plate processes. This section will describe such combinations of techniques.

In one approach, the wafer (or other substrate) may be placed on a hot plate at or near the normal annealing bake temperature, and then a laser spike anneal may be conducted while at an elevated substrate temperature. The wafer would then be left on the hotplate until after the laser anneal is complete to avoid any issues related to rapid temperature changes. The hotplate temperature may also be ramped up or down during or after the laser anneal for optimum control of the full thermal cycle.

In another approach, the wafer may be placed on a chill plate (thermal sink) at or below room temperature and a laser spike annealing may be conducted while the substrate is in thermal contact with the chill plate. The wafer may be left on the chill plate until the spike anneal is complete and the wafer has returned to thermal equilibrium. The chill plate temperature can also be ramped up or down during or after laser annealing for optimum control of the full thermal cycle.

In another approach, a targeted anneal may be performed to repair any DSA-related defects. Specifically, after the laser anneal, if DSA related defects are detected by in-situ or external inspection tools, a wafer map with the coordinates of the defects may be prepared. The wafer could then be re-annealed either with a blanket laser anneal step or by targeting the known defective regions for additional, localized laser annealing. The time and temperature of the additional post-bake laser anneal may be adjusted based on the measured size and extent of the defective regions to maximize defect repair efficiency while minimizing the risk of heat-induced damage to the BCP. The defect repair step can also be performed while the wafer is on a hotplate or a chill plate. It is also possible to target laser annealing of selected areas that are known/expected to require additional thermal processing for DSA, and/or target laser annealing to AVOID regions of the wafer with thermal budget limitations (e.g., due to underlying material sensitivity).

In another approach, it may be recognized that the process of laser annealing may take longer than the dwell time of the scanned laser beam over each point on the wafer. This may be addressed by scanning the same raster pattern across the wafer multiple times (e.g., in an overlapping fashion), or by moving the beam a short distance perpendicular to the scan direction between scanning passes, so that each portion of the wafer is exposed multiple times by offset scans of the beam. The speed of the scan, and hence the integrated dwell time at any location, could be modulated based on the average thermal characteristics of the materials under the BCP layer. Since the heating effect is mainly by penetration of the beam through the relatively transparent upper films, differences in substrate properties could result in thermal gradients in the heating, which could in turn result in incomplete DSA annealing or defect formation.

Figure 7:
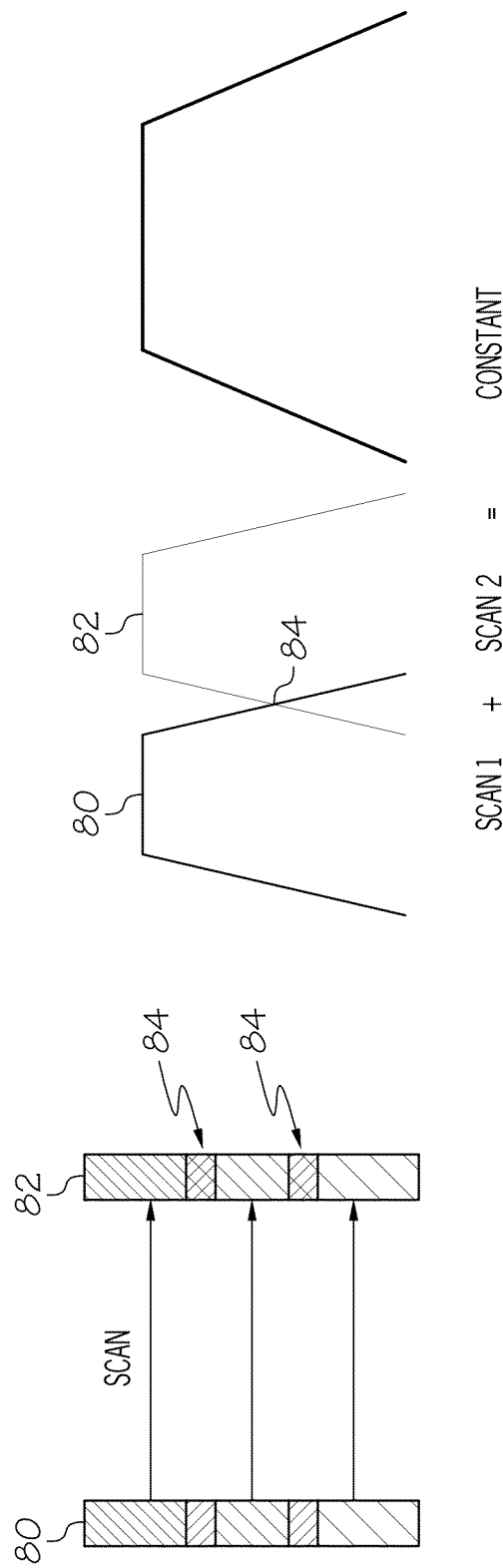
FIG. 7 shows an overlap of multiple laser annealing passes/scans according to an embodiment of the present invention.
Figure 8:
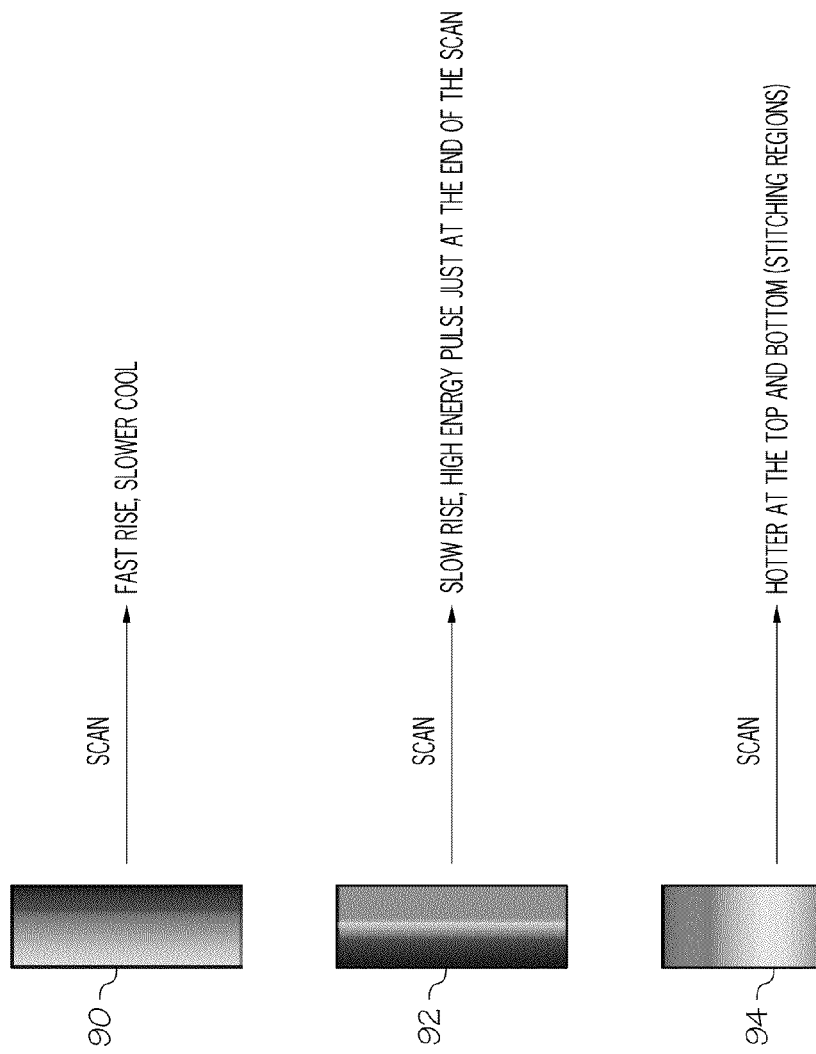
FIG. 8 shows varying energy profiles of laser annealing passes/scans according to an embodiment of the present invention.

An example of overlapping scans is shown in FIG. 7. As depicted, multiple scans 80 and 82 are performed in an overlapping fashion (e.g., with overlap period 84) as opposed to sequentially. Since perfect (seamless, zero overlap) stitching is not typically possible, overlapping the ends of the scans and modulating the intensity at the upper and lower ends of the beam help achieve greatly improved uniformity. Along these lines, different aspects of the scans may be modulated for improved results. Scan speed/intensity may be modulated via feedback from the measured reflected intensity, to account for differences in reflection/absorbance of the substrate. A non-uniform distribution of exposure intensity can also be employed to create desirable temperature versus time behavior. An example of this is shown in FIG. 8, which depicts different energy profiles 90, 92, and 94 in and across the scan. Profile 90 results in a fast temperature rise with a slower cool. Profile 92 results in slow rise with a high energy pulse just at the end of the scan. Profile 94 has higher intensity at the top and bottom regions thereof (e.g., the stitching regions).

Figure 9:
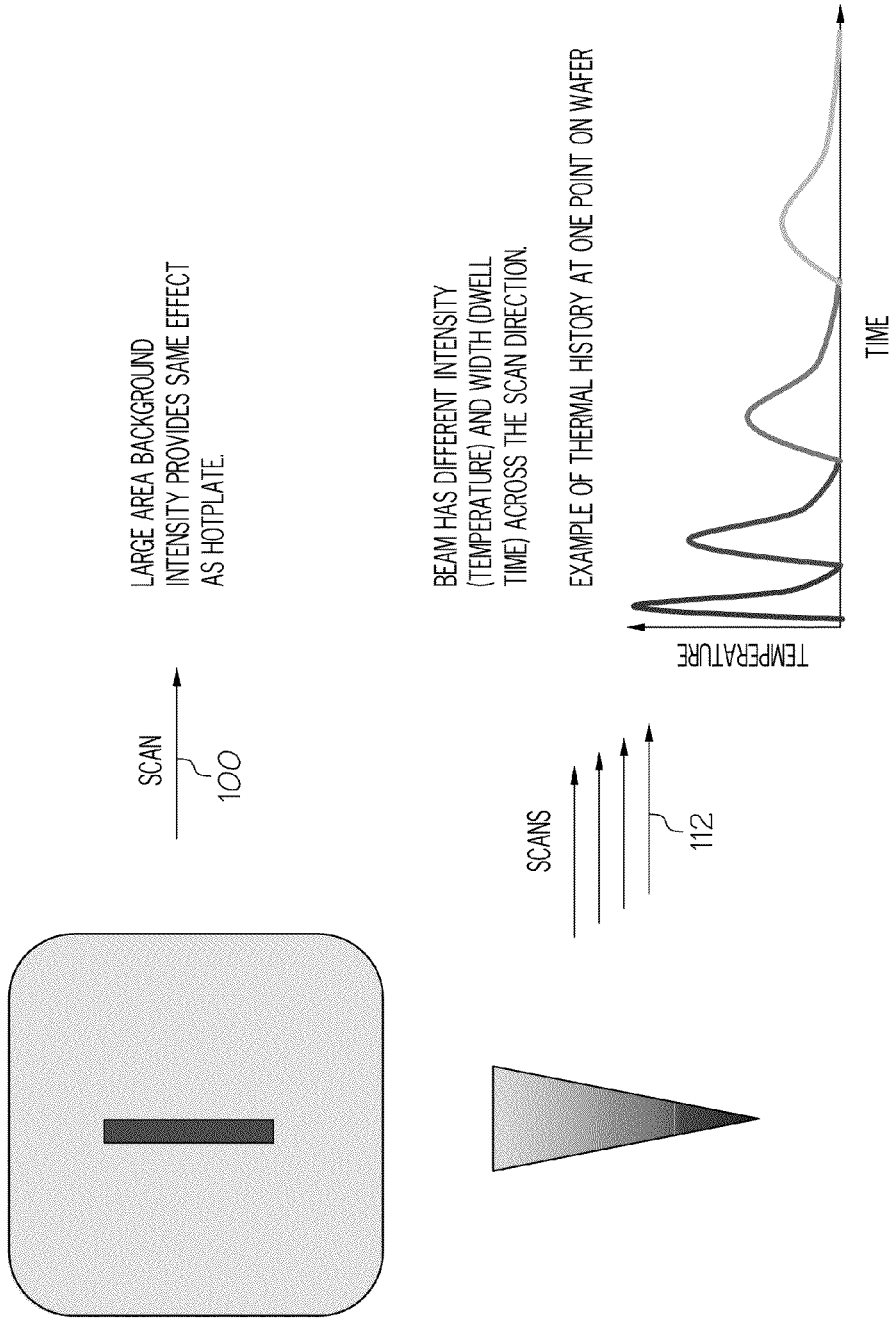
FIG. 9 shows varying beam intensities of laser annealing passes/scans according to an embodiment of the present invention.

The shape of the beam profile could also be modulated to be non-uniform either along or across (perpendicular to) the scan direction to achieve the optimum heating and cooling cycles. In one example, the leading edge of the beam could be made more intense than the trailing edge to provide a more rapid rise in temperature and then a slower cooling rate. The opposite can also be done, leading to a slower heating rise and a fast, high intensity pulse at the end, depending on which thermal profile produces the most effective defect free patterns. Other variations include a Gaussian or mesa profile for a slow rise, hot center, and slower cool down. Modulating the profile perpendicular to the scan direction could also be used in the case of multiple overlapping scans to precisely tailor the heating and cooling cycles between passes. An example of beam profile modulation is shown in FIG. 9. As depicted, scan 100 comprises a single scan with a localized peak intensity that is surrounded by a large region at a lower intensity. This approach provides similar effects as a hotplate approach. Scans 112 have different intensity and width across the scan direction, such that successive offset scans will produce a programmed set of temperature versus time responses at each point on the substrate.

In another approach, desired heating and cooling profiles could also be obtained by utilizing a series of several laser beams arrayed in a line perpendicular to the scan direction to create a "light brush". Along these lines, the beams could be arranged to overlap slightly at their edges and prevent any gaps in coverage. The intensity of the beams in the overlap region would then be reduced so that the total laser power meets the desired intensity profile, either constant or graded across the entire brush. Alternatively, small gaps could be allowed between the beams making up the laser brush, and these gaps would be filled in by appropriately overlapping multiple scans. The intensity of the beams in the overlap regions could then be modulated to achieve the desired intensity profile after all scans are complete.

Figure 10:
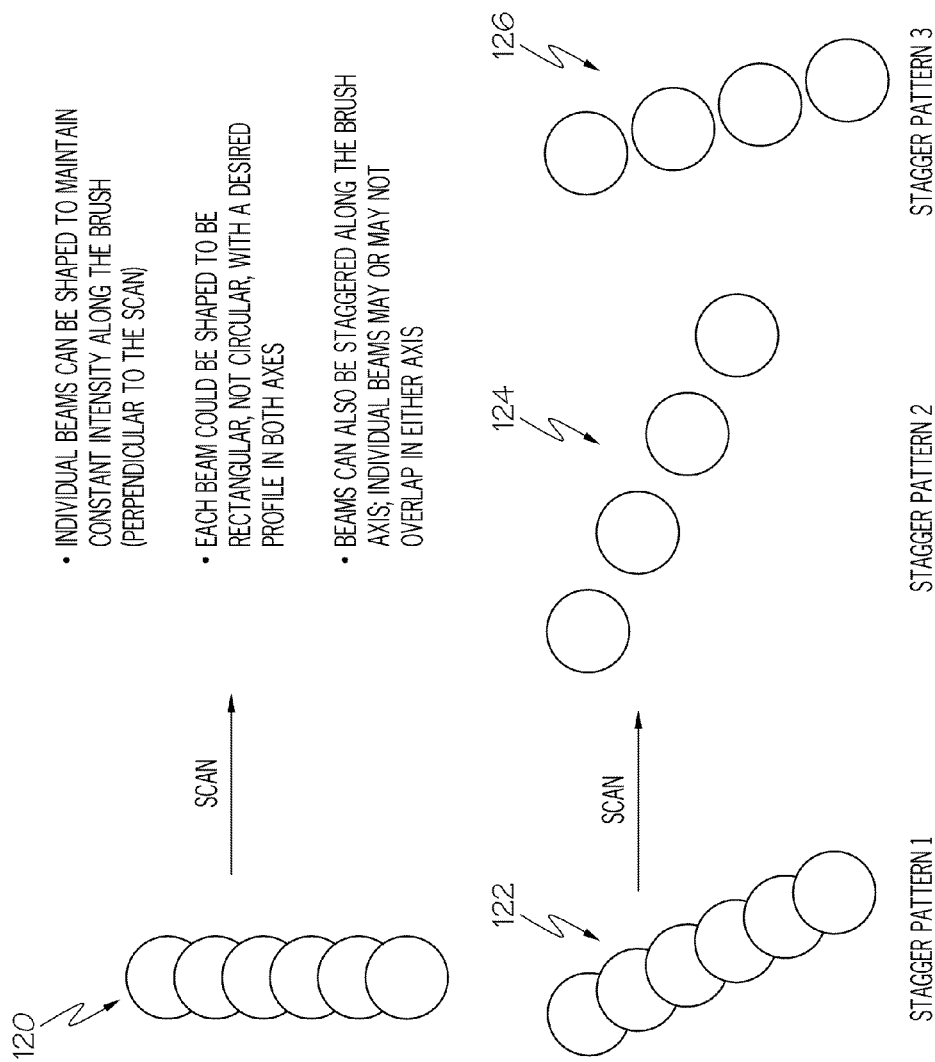
FIG. 10 shows the use of multiple beam profiles/stagger patterns to create a laser brush according to an embodiment of the present invention.

Modulating the intensity of each of the individual beams could also be used to compensate for local variations in the thermal properties of the materials under the BCP layer, such as metal lines embedded in an oxide layer. Instead of being arranged in a perfect line perpendicular to the direction of the scan, the multiple laser beams could also be offset slightly along the scan direction, forming a slanted brush. These offsets could minimize thermal distortion effects at the wafer surface and help achieve better thermal diffusion from the wafer into the thermal sink on which it is located during the annealing process. Modulating the intensity of each of the individual beams could also be used to compensate for local variations in the thermal properties of the materials under the BCP layer, such as metal lines embedded in an oxide layer. Examples of beam patterns are shown in FIG. 10. Specifically, pattern 120 shows a uniform pattern, while patterns 122, 124, and 126 show examples of different types of staggering that may be implemented. Individual beams may be shaped to maintain constant intensity along the brush (perpendicular to the scan). Each beam could be shaped to be rectangular, not circular, with a desired profile in both axes. Beams can also be staggered along the brush axis; individual beams may or may not overlap in either axis.

Figure 11:
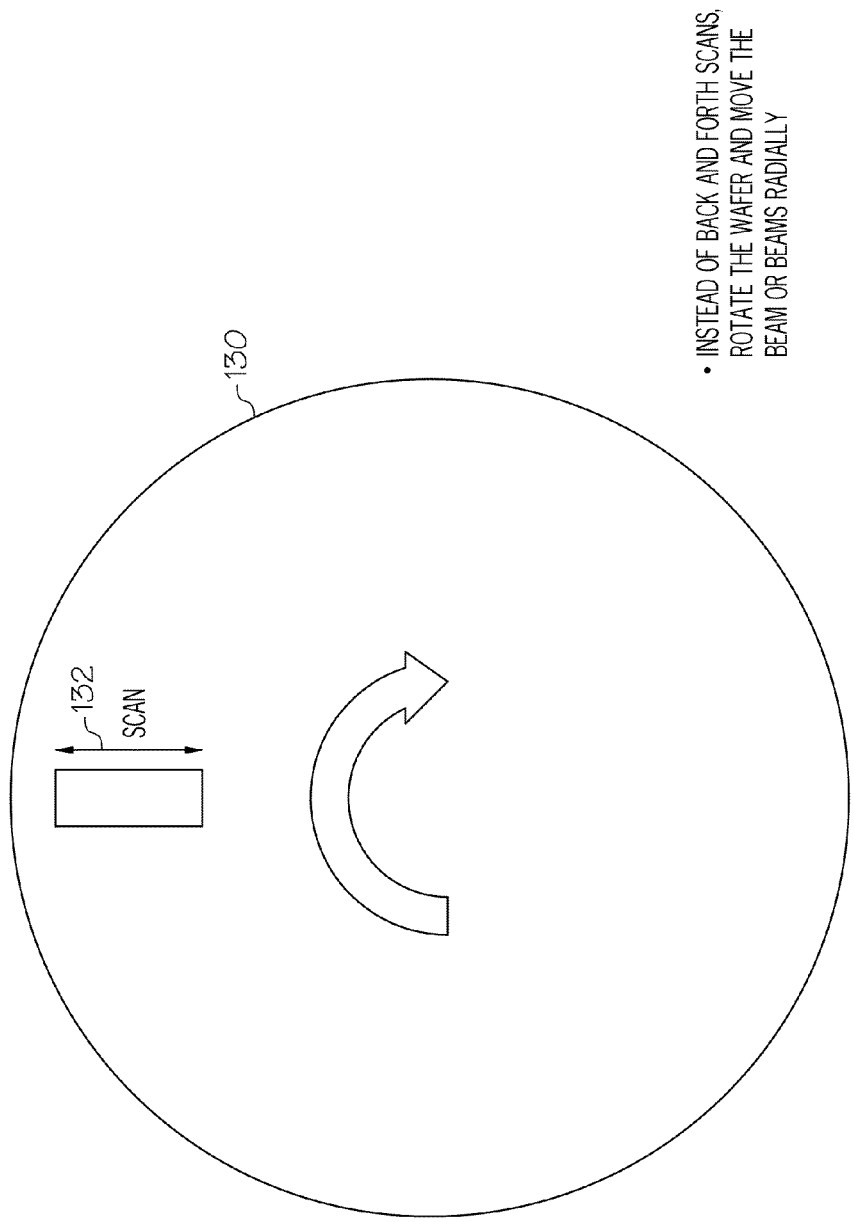
FIG. 11 shows a rotational scanning approach for laser annealing according to an embodiment of the present invention.

In another approach shown in FIG. 11, the process could also be implemented by spinning the wafer 130 about its center point while moving the beam(s) 132 radially towards and/or away from the wafer 130 center (e.g., instead of raster scanning a beam(s) across the wafer in a back and forth manner). This spinning approach could be more efficient by eliminating the wasted overhead time stopping and starting the scans. Achieving the desired thermal profile, whether uniform or tapered, could be accomplished in one of several manners. For example, at a constant angular velocity (rate of rotation in RPM), the linear velocity at the edge of the wafer would be significantly faster than near the center, so the effective dwell time would be lower. This could be compensated by increasing the laser power when moving from the center of the wafer out to the edge and reducing power when scanning back in towards the center. The profile of the laser power in the radial direction could also be graduated so the total power delivered to each location on the wafer is the same, or corrected for the average heat absorption of the underlying materials.

Alternatively, the rotation rate could be increased as the beam scans inwards towards the center and decreased as the beam scans outwards to maintain the desired thermal profile, whether that desired profile is uniform or modulated due to variations in the thermal properties of the underlying films. Moreover, the concept of the light brush of multiple beams, either in a perfect row or staggered along the direction of rotation, can also be applied to the scanning implementation described herein.

IV. Additional Considerations

Figure 12:
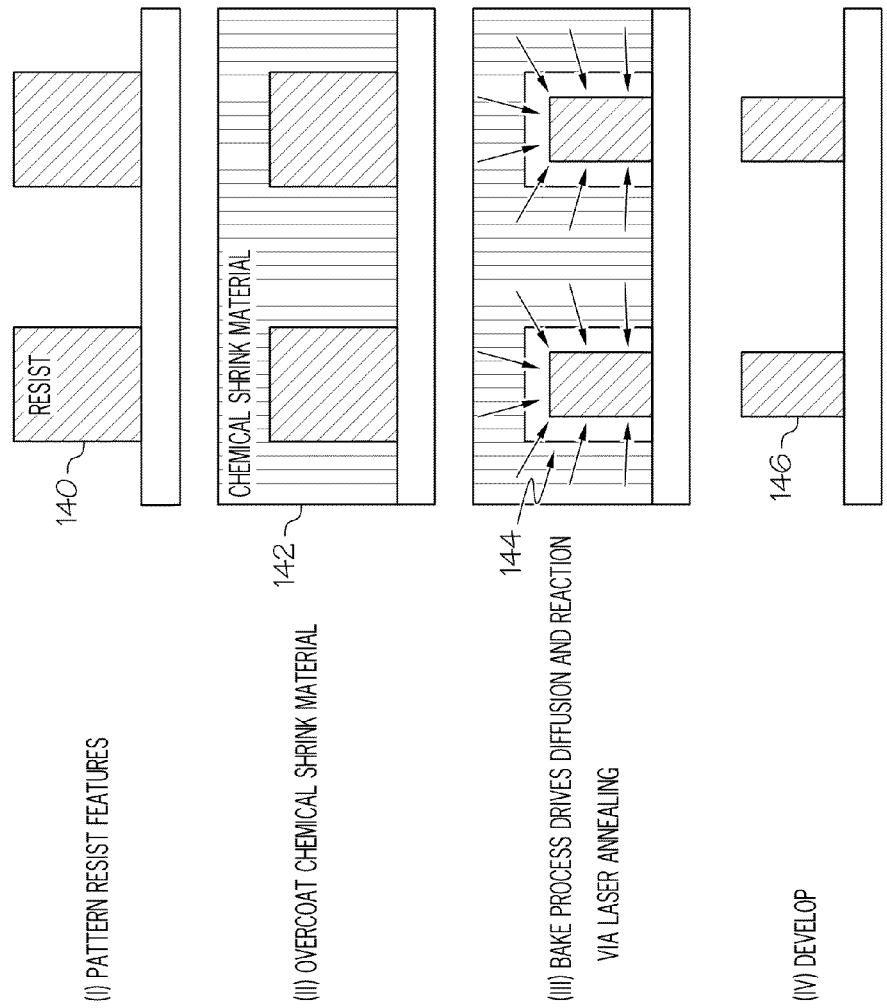
FIG. 12 shows the use of laser annealing to reduce photoresist dimensions by chemical shrinking of post development photoresist pattern according to an embodiment of the present invention.

As indicated above, the laser annealing process described herein could be used in one or more passes (e.g., using various approaches/techniques) and/or in conjunction with other techniques such as thermal processing, laser processing, etc. Moreover, the laser annealing methodologies/implementations described herein could be used for lithographic processes other than DSA. For example, as shown in steps I-IV of FIG. 12, laser annealing could be used to control chemical shrinking during lithography. That is, resist 140 features may be patterned in Step I, and an overcoat of chemical shrink material 142 may be applied in step II. Then, in step III, a bake process 144 (e.g., via laser annealing) may be applied to drive diffusion and reaction followed by a developing process 146 shown in step IV.

Figure 13:
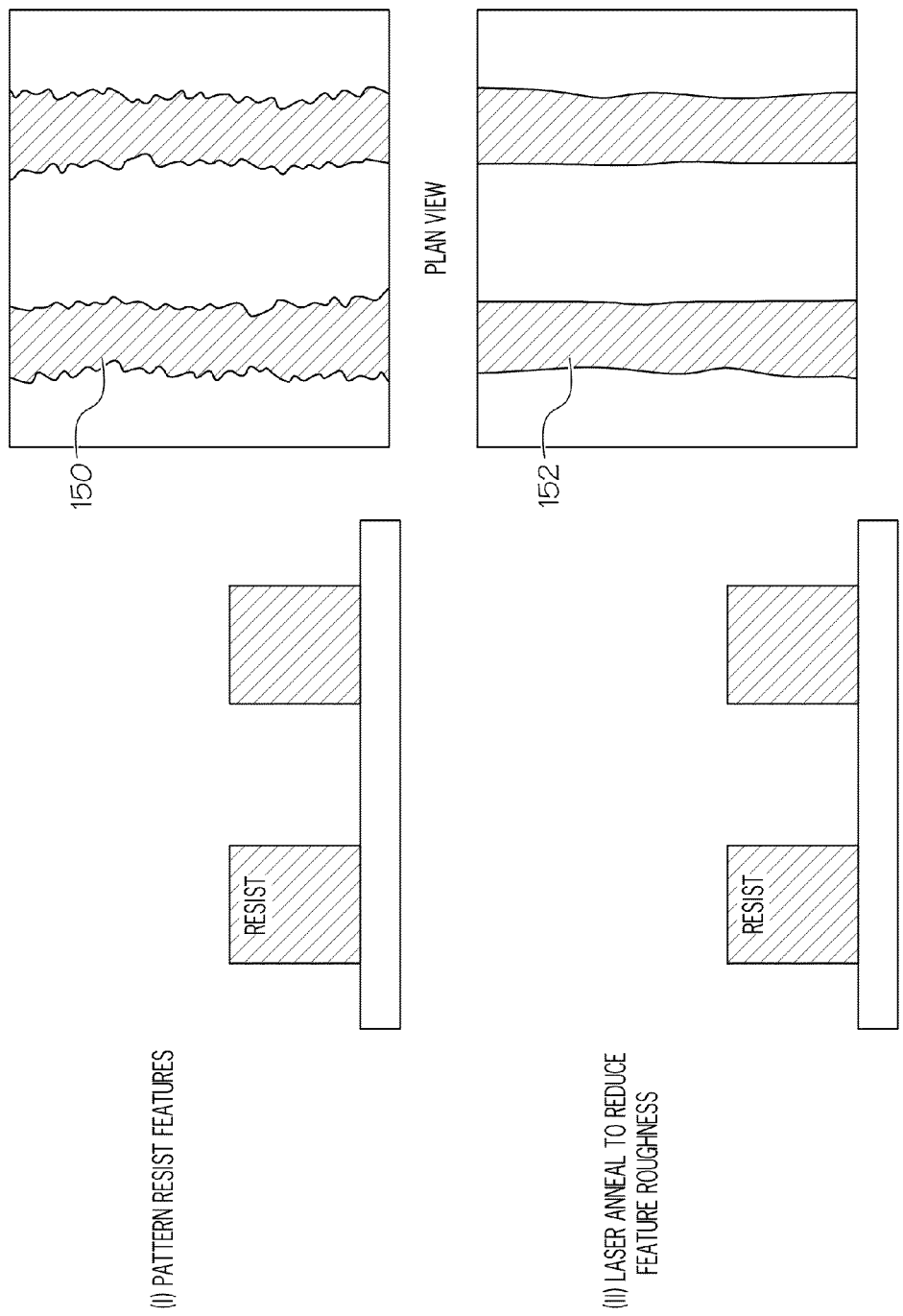
FIG. 13 shows the use of laser annealing to reduce resist pattern roughness during lithographic processes according to an embodiment of the present invention.

Still yet, laser annealing could be utilized to optimize surface properties such as reducing resist feature roughness (resist smoothing). An example of this is shown in steps I and II of FIG. 13. In step I, resist features are patterned, which provides a rough profile 150. However, by applying a laser annealing pass in step II, the profile 152 becomes smoother.

It is understood that any of the embodiments recited herein may have typical processing conditions (e.g., materials, times, etc.) Shown below are illustrative examples of such conditions.

Exemplary Materials:
  DSA BCPs:
  PS-block-PMMA [PS=polystyrene, PMMA=polymethylmethacrylate]
  PS-block-PDMS [PDMS=polydimethylsiloxane]
  PS-block-PI [PI=polyisoprene]
  DSA neutral layers/orientational control layers:
  PS-ran-PMMA
  PS-ran-PDMS
  PS-ran-PI
  Thermal cross-linking functional groups:
  Benzocyclobutane
  Hydroxyethylmethacrylate
  Glycidyl methacrylate
  Epoxides
  Cinnamates
  Radiation absorbing functional groups:
  Carbonyls
  Alkynes
  Alkenes
  Nitriles
  Polycyclic aromatic compounds
Laser Radiation Wavelengths
  Near IR wavelengths from 750 nm to 1400 nm
  Long Wavelength IR from 8-15 microns
  Continuous wave diode lasers
  Continuous wave carbon dioxide lasers
Laser Intensity
  Intensity from 20 to 2000 Watts per square millimeter
  Preferred intensity is 80 to 240 Watts per square millimeter
Peak Temperature
  150 C to 550 C
Laser Dwell Time
  10 microseconds to 1 second
  Preferred dwell time 0.5 to 50 milliseconds In various embodiments, design tools may be provided and configured to create the data sets used to pattern the semiconductor layers as described herein. For example data sets may be created to generate photomasks used during lithography operations to pattern the layers for structures as described herein. Such design tools can include a collection of one or more modules and can also include hardware, software, or a combination thereof. Thus, for example, a tool may be a collection of one or more software modules, hardware modules, software/hardware modules, or any combination or permutation thereof. As another example, a tool may be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLAs), logical components, software routines, or other mechanisms might be implemented to make up a module. In implementation, the various modules described herein might be implemented as discrete modules or the functions and features described may be shared in part or in total among one or more modules. In other words, as would be apparent to one of ordinary skill in the art after reading this description, the various features and functionality described herein may be implemented in any given application and may be implemented in one or more separate or shared modules in various combinations and permutations. Even though various features or elements of functionality may be individually described or claimed as separate modules, one of ordinary skill in the art will understand that these features and functionality may be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention.

Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for optimizing a lithographic process, comprising:
  subjecting a substrate to a lithographic process having a set of stages, the lithographic process comprising a directed self assembly (DSA) process; and
  applying a set of laser annealing passes to the substrate to optimize at least one of the set of stages, the set of laser annealing passes comprising:
    a first laser annealing pass to optimize a phase separation stage of the DSA process; and
    a second laser annealing pass to facilitate a set of chemical reactions occurring pursuant to the DSA process,
    wherein the first laser annealing pass is applied via a first technique and the second laser annealing pass is applied via a second technique.

2. The method of claim 1, the first laser annealing pass comprising applying a laser anneal to perform at least one of the following tasks:
  facilitate DSA pattern formation;
  assist grafting and/or cross-linking of a polymeric surface treatment;
  maintain a phase-mixed state of a block co-polymer (BCP);
  drive off a solvent;
  promote a reaction of an etch-rate modifier;
  reduce the roughness of a pattern;
  induce chemical shrink by reaction-diffusion;
  combine multiple wavelength irradiations; or
  selectively heat at least one component of the BCP.

3. The method of claim 1, the set of chemical reactions comprising at least one of the following: a chemical decomposition reaction, or a chemical cross-linking reaction.

4. The method of claim 1, the first technique having a first beam profile, and the second technique having a second beam profile.

5. The method of claim 1, further comprising a product formed according to the method of claim 1.

6. A method for optimizing a lithographic process, comprising:
  subjecting a substrate to a lithographic process having a set of stages;
  applying a set of laser annealing passes to the substrate; and
  applying a set of additional processing techniques to the substrate, the set of laser annealing passes and the set of additional processing techniques optimizing at least one of the set of stages, the set of additional processing techniques comprising a set of hotplate annealing passes.

7. The method of claim 6, the lithographic process comprising a directed self assembly (DSA) process.

8. The method of claim 7, the set of laser annealing passes comprising a first laser annealing pass to optimize a phase separation stage of the DSA process.

9. The method of claim 8, the first laser annealing pass comprising applying a laser anneal to perform at least one of the following:
  facilitate DSA pattern formation;
  assist grafting and/or cross-linking of a polymeric surface treatment;
  maintain a phase-mixed state of a block co-polymer (BCP);
  drive off a solvent;
  promote a reaction of an etch-rate modifier;
  reduce the roughness of a pattern;
  induce chemical shrink by reaction-diffusion;
  combine multiple wavelength irradiations; or
  selectively heat at least one component of the BCP.

10. The method of claim 8, the set of laser annealing passes further comprising a second laser annealing pass to facilitate a set of chemical reactions occurring pursuant to the DSA process.

11. The method of claim 10, the set of chemical reactions comprising at least one of the following: a chemical decomposition reaction, or a chemical cross-linking reaction.

12. The method of claim 10, the first laser annealing pass being applied via a first technique and the second laser annealing pass being applied via a second technique.

13. The method of claim 12, the first technique having a first beam profile, and the second technique having a second beam profile.

14. The method of claim 6, further comprising a product formed according to the method of claim 6.

15. A method for optimizing a lithographic process, comprising:
  subjecting a substrate to a directed self assembly (DSA) process, the DSA process having a set of stages;
  applying a first laser annealing pass to the substrate; and
  applying a second laser annealing pass to the substrate,
  wherein the first laser annealing pass is delivered via a first technique, and the second laser annealing pass is delivered with a second technique.

16. The method of claim 15, at least a portion of the first laser annealing pass overlapping with at least a portion of the second laser annealing pass.

17. The method of claim 15, the first laser annealing pass and the second laser annealing pass being delivered with varying beam intensities.

18. The method of claim 15, the first laser annealing pass and the second laser annealing pass being delivered with varying scan speeds.

19. The method of claim 15, the first laser annealing pass and the second laser annealing pass being delivered with varying beam profiles.

20. The method of claim 15, further comprising applying a set of additional processing techniques to the substrate.

21. The method of claim 15, the set of additional processing techniques comprising a set of hotplate annealing passes.

22. The method of claim 15, further comprising a product formed according to the process of claim 15.

* * * * *